United States Patent [19] [11] Patent Number: 4,577,228
Arai et al. [45] Date of Patent: Mar. 18, 1986

[54] TRANSVERSAL FILTER INCORPORATING MOS-TRANSISTOR AMPLIFIERS

[75] Inventors: Ikuya Arai; Toshinori Murata, both of Yokohama; Masafumi Kazumi, Tokyo, all of Japan

[73] Assignee: Hitachi, Ltd., Tokyo, Japan

[21] Appl. No.: 614,667

[22] Filed: May 29, 1984

[30] Foreign Application Priority Data

May 27, 1983 [JP] Japan .................................. 58-92285

[51] Int. Cl.4 .......................... H04N 5/213; H03F 3/45
[52] U.S. Cl. ..................................... 358/167; 358/905; 330/253
[58] Field of Search ..................... 358/167, 905, 160; 333/18; 375/14; 330/253, 254; 307/362, 530

[56] References Cited

U.S. PATENT DOCUMENTS 4,284,957 8/1981 Hague ................................. 330/253
4,303,895 12/1981 Ohnishi et al. ....................... 358/905

OTHER PUBLICATIONS

Makino et al., A Novel Automatic Ghost Canceller, IEEE Transactions on Consumer Electronics, vol. CE-26, Aug. 1980, pp. 629–637.

Primary Examiner—James J. Groody
Assistant Examiner—Howard L. Carter
Attorney, Agent, or Firm—Antonelli, Terry & Wands

[57] ABSTRACT

A transversal filter suitable for use in a ghost canceller of television receiver. The amplifiers of the transversal filter employ MOS transistors each loaded by a complementary connection of a P-MOS transistor and an N-MOS transistor constituting a C-MOS transistor pair.

2 Claims, 19 Drawing Figures

TRANSVERSAL FILTER INCORPORATING MOS-TRANSISTOR AMPLIFIERS

BACKGROUND OF THE INVENTION

1. Field of the Invention

The present invention relates to a transversal filter used in a ghost image canceller of a television receiver and, more particularly, to a transversal filter incorporating MOS transistor amplifiers with their load circuits made up of C-MOS transistors.

2. Description of the Prior Art

The radio wave radiated from a transmission antenna of a television broadcasting station is reflexible on artificial constructions. When a television reception antenna receives a wave coming directly from a transmission antenna, i.e., desired wave, and waves reflected on buildings and the like, an image of the desired wave is superimposed by offset images of the reflected waves, so called "ghost images", on the face plate of the television receiver. The ghost image is a major cause of the impairment of picture quality to television receivers, and various means have been devised for the elimination and prevention of ghosts. One example of such devices is a ghost canceller using a transversal filter. The device has a delay circuit formed in a serial connection of a plurality of delay elements each having a small time lag. The outputs of the delay elements are summed on a cumulative basis so as to cancel ghosts, and a signal getting rid of the ghosts, i.e., a signal compensated against ghosts, is obtained. The above-mentioned ghost canceller is described in an article entitled "A NOVEL AUTOMATIC GHOST CANCELLER" by S. Makino et al., IEEE Trans. CE-26, No. 3, Aug. 1980, p. 629.

FIG. 1 shows in block form the conventional ghost canceller using a transversal filter, and FIG. 2 shows in block form details of the transversal filter. This ghost canceller is located within the video signal amplifying stage, with its input terminal receiving a video signal including ghosts. The video signal received at the input terminal 1 is fed through a transversal filter 3 and sent out through an output terminal 2 to the next stage (not shown). The ghosts included in the video signal are mostly eliminated by the transversal filter 3, and the video signal including little residual ghosts is sent out through the terminal 2. For elimination, a ghost image component included in the video signal at the output of the filter 3 is detected, generally by using the vertical sync pulse. Thus, ghosts superimposed on the vertical sync signal are detected.

The video signal received at the input terminal 1 is also supplied to a sync separator 12 by which the vertical sync pulse is separated. The separated vertical sync pulse is delivered to a timing generator 13 and used as a trigger for generating timing signals. A reference signal generator 5 responds to a timing signal from the timing generator 13 to produce a reference signal having the same waveform as of the vertical sync pulse, and the reference signal synchronized with the vertical sync pulse is delivered to a subtracter 4, which also receive the video signal via the filter circuit 3. The subtracter 4 performs subtraction between the video signal including the vertical sync pulse and the reference signal produced by the reference signal generator 5, and consequently, a ghost component superimposed on the vertical sync pulse in the video signal is extracted. The detected ghost component is differentiated by a differentiator 6 and fed to a comparator 7, by which the differentiated signal is shaped into a digital pulse in accordance with two threshold levels of the comparator 7. The pulse signal enters a shift register 8, the timing of which is controlled by the timing generator 13. Binary data in the shift register 8 is read out to a subtracter 9 so that the gain data stored in a tap gain memory 10 are modified. Namely, the contents of the tap gain memory 10 are also given to the subtracter 9 and the difference of the two subtracter inputs is fed to the tap gain memory 10. The contents of the tap gain memory 10 are modified again.

Upon completion of this process, the tap gain data in the memory 10 is read out to a D/A converter 11, by which the data is converted into an analog voltage V. The analog voltage V is applied as a control voltage to a tap amplifier 16 in the transversal filter 3 so that the gain of the amplifier 16 is controlled. As a result, a video signal with an alleviated ghost component is provided at the output of the filter circuit 3. This process is repeated and, eventually, the transversal filter 3 provides the video signal including almost no ghost component.

The operation of the ghost canceller shown in FIG. 1 will further be explained using the signal waveforms shown in FIG. 3 observed at various portions of the arrangement of FIG. 1. In FIG. 3, waveform (a) represents the reference signal produced by the reference signal generator 5, with symbol "F" indicating the positive-going edge of the signal. Waveform (b) represents a vertical sync pulse included in the video signal provided by the transversal filter 3, and a ghost component is shown by hatching. Waveform (c) represents a ghost component extracted through the subtraction process conducted by the subtracter 4. Waveform (d) represents the output pulse P of the differentiator 6 produced in response to the ghost component.

At a timing of the edge F of the reference signal, the control signal (gate pulse) is sent from the timing generator 13 to the shift register 8, and the shift register 8 starts operating at this moment. The pulse P from the comparator 7 enters the shift register 8 on expiration of time T following the edge F of the reference signal. The shift register 8 stores the ghost image information of a certain number of bits and sends the information sequentially to the subtracter 9.

Subsequently, the modification operation for data stored in the tap gain memory 10 begins. The tap gain memory 10 is addressed in correspondence to tap amplifiers 16 ($C_1$ through $C_5$), and tap gain data in the address locations of the memory 10 are modified in the order correspondingly from an amplifier for the input signal with smaller delay to an amplifier for the input signal with larger delay, i.e., in the order of $C_1$, $C_2$, ..., and $C_5$ in this example. After all data stored in the tap gain memory 10 have been modified, new tap gain data is given to each tap amplifier 16 of the transversal filter 3. Data read out from the tap gain memory 10 is converted into an analog voltage V by the D/A converter 11, and it is applied to the tap amplifiers 16 ($C_1$–$C_5$).

The video signals with their amplitudes varied by the tap amplifiers 16 ($C_1$–$C_5$) are supplied to delay elements 151 through 155. The video signal is delayed in predetermined time lengths by the delay elements 151–155 and synthesized into a signal, which is delivered to an adder 14. The adder 14 also receives the video signal from the terminal 1 so that it is added to the delayed video signals, and the resultant video signal is sent out through the terminal 2.

Since the processes of ghost detection, data modification for the tap gain memory 10, and application of the control voltage to each tap amplifier are carried out using a signal synchronized with the vertical sync pulse, these operations take place once in every field cycle until the ghost component is no longer detected. Thus, the ghosts are alleviated progressively.

The transversal filter 3 in the foregoing ghost canceller employs video signal amplifiers 16 and 18 as shown in FIG. 2. The amplifier 18 receives the video signal and provides two output signals having exactly the same amplitude and d.c. level, by opposite polarities. The reason why the dual-polarity amplifier 18 is used for the transversal filter 3 is that a ghost component superimposed on the video signal can have not only a like polarity, but also an opposite polarity with respect to the video signal, and a polarity selector switch 17 provided at the input of the tap gain amplifier 16 is set to the uninverted position (X) for the amplifier 18 when the ghost component is of the like polarity, or it is set to the inverted position (Y) when the ghost image is of opposite polarity, whereby ghosts of any polarity can be eliminated.

The conventional arrangement of the video signal amplifier will be described. The amplifier 18 is configured in a well-known differential amplifier as shown in FIG. 4. This differential amplifier consists of three N-MOS transistors 27, 28 and 29, load resistors 21 and 22 connecting the drain electrodes of the transistors 27 and 28 to a power supply 20, and bias voltage sources 26 and 30 for providing bias voltages to the gate electrodes of the transistors 28 and 29, respectively. The input signal is applied to a terminal 25 which is connected to the gate electrode of the transistor 27. The drain electrode of the transistor 27 is led out to an output terminal 23 which provides an output signal in opposite polarity with respect to the input signal, and the terminal 23 is connected to the contact Y of the polarity selector switch 17 in FIG. 2. The drain electrode of the transistor 28 is led out to an output terminal 24 which provides an output signal in like polarity with respect to the input signal, and the terminal 24 is connected to the contact X of the polarity selector switch 17 in FIG. 2.

The differential amplifier shown in FIG. 4 has a satisfactory linearlity, and in order for the amplifier to have a large gain and consumes less power, a large resistance needs to be selected for the load resistors 21 and 22. However, fabrication of such resistors within an integrated circuit would occupy a large area on the chip, and therefore, this arrangement is not suited for integration. This affair will further be described in the following.

FIG. 5 shows the d.c. input-output characteristics of the differential amplifier shown in FIG. 4. In the figure, the ordinate indicates output voltage Vout, the abscissa indicates the input voltage Vin. The curves $V_{01}$ and $V_{02}$ represent the noninverted and inverted input-output characteristics, respectively. At the intersection of both curves $V_{01}$ and $V_{02}$, the input voltage level is equal to the reference bias voltage ($+V_{BB}$). The actual operating range of the differential amplifier is a section $V_R$ extending on both sides of the intersection, and the gradient of the curves at the intersection indicates the gain of the differential amplifier. The gradient of both curves is substantially constant in a wide range, creating less distortion in the output waveform, i.e., providing satisfactory linearity. However, due to the correlation between the gain and the load resistance, a large resistance must be selected for the load resistors 21 and 22, as will be explained in connection with the following expression.

$$Av = \pm gm\, R_L \quad (1)$$

where Av represents the voltage gain, gm represents the mutual conductance of the driving MOS transistors 27 and 28, $R_L$ represents the resistance of the load resistors 21 and 22, the positive sign is applied to the case of the noninverted output, and the negative sign is applied to the case of the inverted output. The mutual conductance gm is determined depending on the property of the MOS transistors 27 and 28 and is substantially constant, and therefore, the resistors 21 and 22 must have a large resistance $R_L$ in order to provide a large gain, as can be seen from Expression (1). In general, load resistors of several kiloohms or more are needed to obtain a voltage gain of 0 dB or higher. Such resistors, when integrated on a semiconductor chip, occupy a considerable area and also can have a large error in the value of resistance, and therefore, the use of resistors in load circuits of the transistors 27 and 28 is not desirable.

FIG. 6 shows a differential amplifier with its load resistors replaced with N-MOS transistors. In the arrangement, N-MOS transistors 31 and 32 are used as loads of the transistors 27 and 28. The advantage of this differential amplifier is its fabrication in a smaller area because resistors are not used in the load circuit. However, it has a drawback of inferior linearity as compared with the differential amplifier shown in FIG. 4, as will be explained in the following.

FIG. 7 shows the d.c. input-output characteristics of the differential amplifier shown in FIG. 6. On the graph, the output voltage Vout is plotted on the ordinate against the input voltage Vin on the abscissa, and the curves $V_{04}$ and $V_{05}$ represent the inverted and noninverted outputs, respectively. The input voltage level is equal to the input reference bias voltage ($+D_{BB}$) at the intersection of both curves $V_{04}$ and $V_{05}$. In the characteristics of FIG. 7, the gradient of the slope of both curves $V_{04}$ and $V_{05}$ is not constant within the operating range, resulting in an inferior linearity, i.e., the output voltage does not vary constantly with respect to the variation of the input voltage, as compared with the characteristics of FIG. 5. FIG. 8 shows the on-resistance characteristics of the N-MOS transistor of a load. On the graph, the ordinate indicates on-resistance Ron-N, the abscissa indicates the drain-source voltage $V_{DS}$ of the N-MOS transistor of the load. When the input signal is applied to the input terminal 25 of the differential amplifier of FIG. 6, the drain-source voltage of the driving MOS transistors 27 and 28 varies, causing the drain-source voltage $V_{DS}$ of the loading N-MOS transistors 31 and 32 to vary. The variation of the drain-source voltage $V_{DS}$ of the loading N-MOS transistors 31 and 32 is accompanied by the variation in the on-resistance, and thus, the load resistance varies depending on the magnitude of the input voltage. On this account, a constant voltage gain cannot be obtained as can be seen from Expression (1). Thus, the differential amplifier of FIG. 6 is inferior to the differential amplifier shown in FIG. 4 in the property of linearity.

Differential amplifier as shown in FIG. 4 occupies a large chip area due to load resistors and are unsuited for high density integration as mentioned previously, while differential amplifier as shown in FIG. 6 provides unsatisfactory linearity. The linearity of amplifier is an influential factor on the deghosting effect of the ghost canceller, the reason of which will be described in the following.

FIG. 9 shows the simplified waveform of the video signal, with symbol A indicating the sync pulse, while symbol B indicating the maximum white level. FIG. 10 shows the waveform of the video signal which is superimposed by a ghost component of the same polarity. As described previously, the ghost canceller detects a ghost component G superimposed on the sync pulse A, and it is used to control the tap gain of each tap amplifier 16 so as to produce inverted ghost waveforms. The inverted waveforms are added to the input video signal by the adder 14 so that the ghost component on the sync pulse A and maximum white level B are eliminated. In this case, the ratio of the magnitude of ghost component on the sync pulse to the magnitude of ghost component on the maximum white level B at the input of the tap amplifier 16 must be equal to the ratio of the magnitude a of the sync pulse to the magnitude of the maximum white level b. However, the amplifier with inferior linearity as shown in FIG. 6 creates a distortion at a portion of the maximum white level B as shown in FIG. 11, resulting in a varied amplitude ratio of the sync pulse A to the maximum white level B. Therefore, the inverted ghost waveforms are also distorted, and the ghost canceller solely eliminates the ghost component in the portion of the sync pulse A, leaving the ghost component unremoved in the portion of the maximum white level B. The process for the video signal superimposed by a ghost component in opposite polarity is exactly the same as of the video signal superimposed by a ghost component in like polarity as described in connection with FIGS. 10 and 11. Furthermore, tap amplifiers 16 having characteristics of distortion lead to exactly the same result, and the deghosting effect is impaired.

SUMMARY OF THE INVENTION

It is an object of the present invention to provide a transversal filter suitable for a ghost image canceller and incorporating an amplifier of satisfactory linearity so that ghosts included in the video signal can perfectly be eliminated.

In the amplifier of the inventive transversal filter, the amplifying transistors are loaded by complementary connections of P-MOS and N-MOS transistors.

DESCRIPTION OF THE PREFERRED EMBODIMENTS

Figure 5:
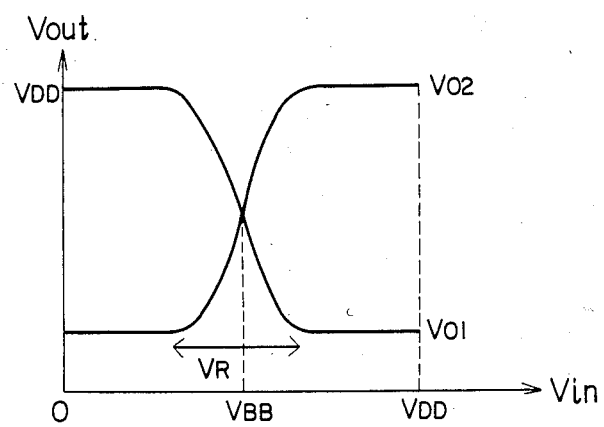
FIG. 5 is a graph showing the d.c. input-output characteristics of the amplifier shown in FIG. 4.
Figure 6:
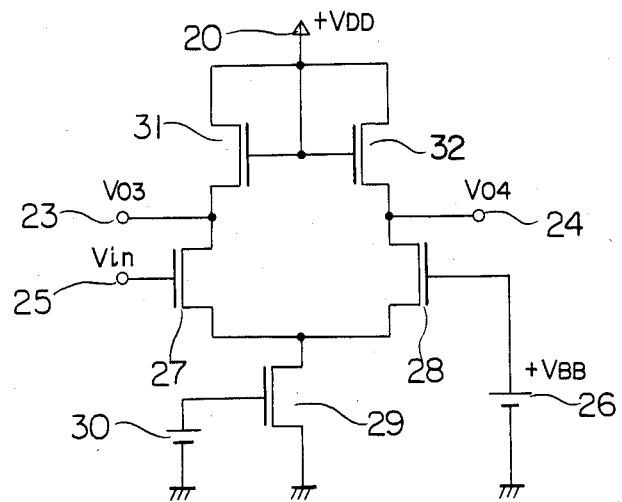
FIG. 6 is a schematic diagram of the conventional differential amplifier having load circuits of N-MOS transistors.
Figure 7:
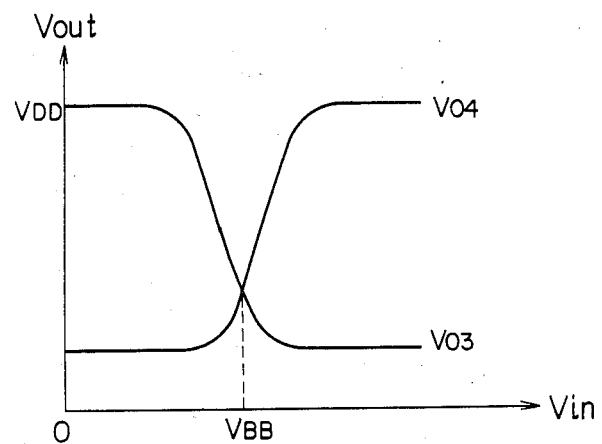
FIG. 7 is a graph showing the d.c. input-output characteristics of the amplifier shown in FIG. 6.
Figure 12:
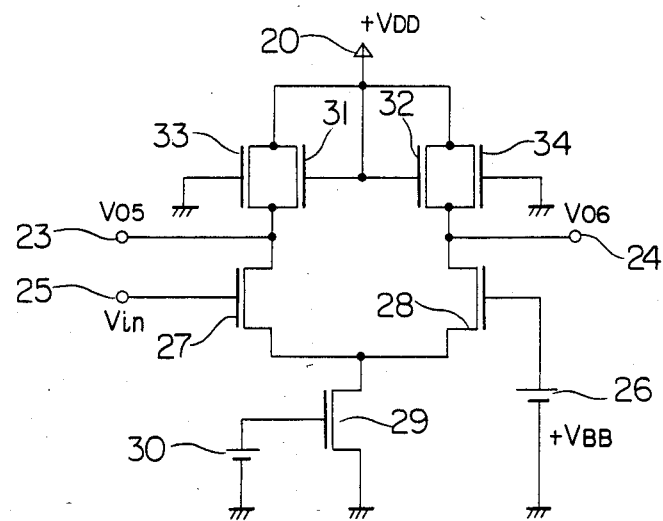
FIG. 12 is a schematic diagram showing the differential amplifier of a C-MOS load circuit type according to the present invention.
Figure 13:
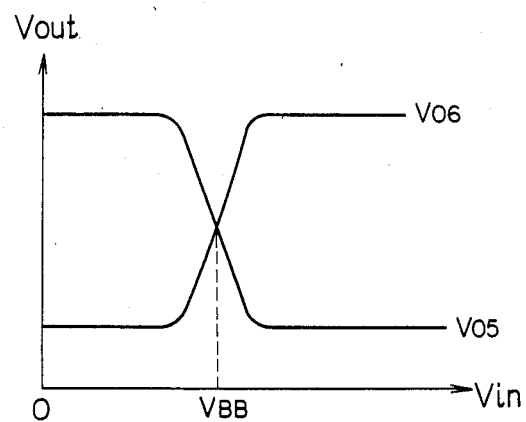
FIG. 13 is a graph showing the d.c. input-output characteristics of the amplifier shown in FIG. 12.

The present invention will now be described with reference to the drawings. FIG. 12 shows one embodiment of the amplifier used in the inventive transversal filter. As mentioned previously, the tap gain control circuit for the transversal filter used in the ghost canceller needs to receive an input video signal and two tap amplifier input signals of the equal amplitude, but opposite polarities. The arrangement of FIG. 12 includes P-MOS transistors 33 and 34 in parallel connection with N-MOS transistors 31 and 32, respectively, forming two sets of C-MOS transistor pairs that constitute load circuits of transistors 27 and 28. FIG. 13 shows the d.c. input-output characteristics of the amplifier shown in FIG. 12, where the ordinate indicates the output voltage Vout, the abscissa indicates the input voltage Vin, and the curves $V_{05}$ and $V_{06}$ represent the inverted and noninverted outputs, respectively. The characteristics shown in FIG. 13 are mostly identical to the d.c. input-output characteristics of the differential amplifier with resistor load circuits shown in FIG. 5, the reason of which will be explained in the following.

Figure 4:
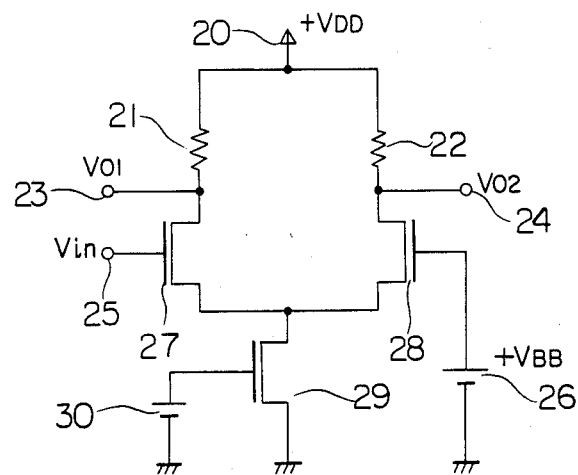
FIG. 4 is a schematic diagram of the conventional differential amplifier having resistor load circuits.
Figure 8:
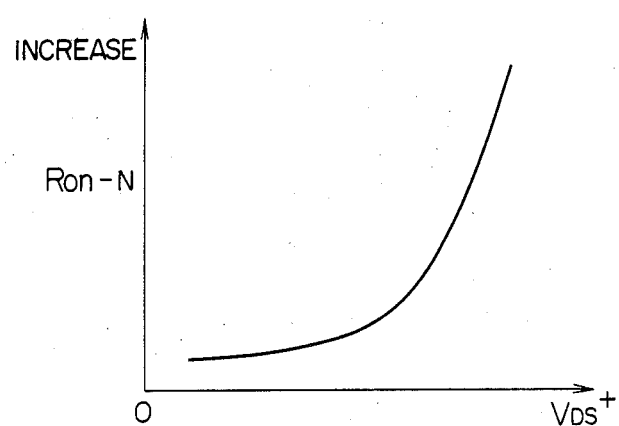
FIG. 8 is a graph showing the on-resistance characteristics of the N-MOS transistor.
Figure 9:
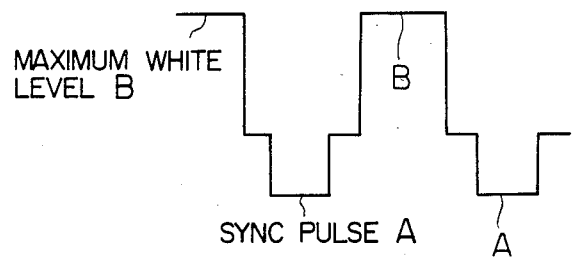
FIG. 9 is a waveform diagram showing, in a simplified form, the video signal.
Figure 10:
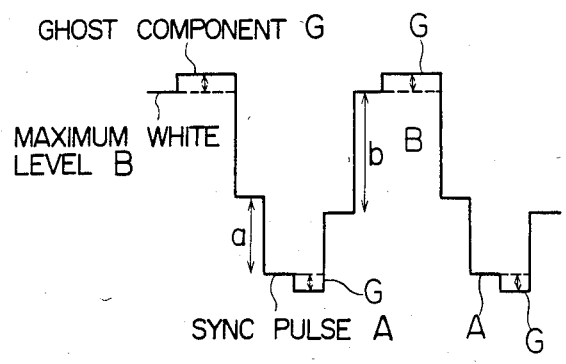
FIG. 10 is a waveform diagram showing the video signal superimposed by a ghost component.
Figure 11:
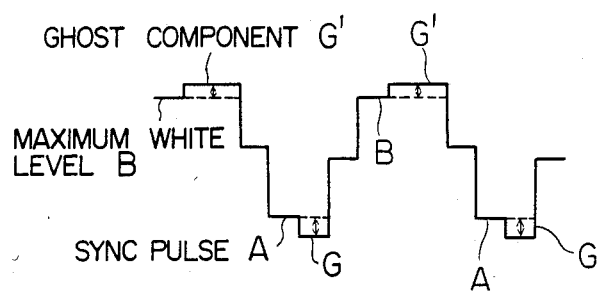
FIG. 11 is a waveform diagram showing the video signal amplified by the amplifier of inferior linearity.
Figure 14:
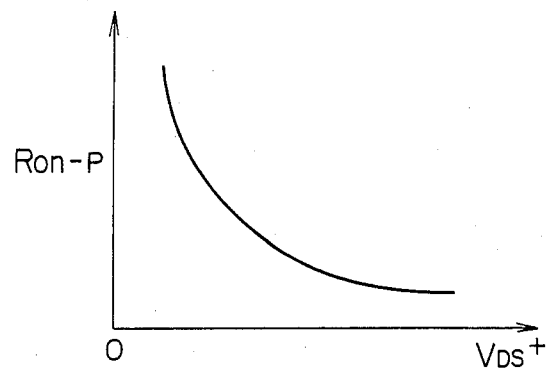
FIG. 14 is a graph showing the on-resistance of the P-MOS transistor in relation with $V_{DS}$.
Figure 15:
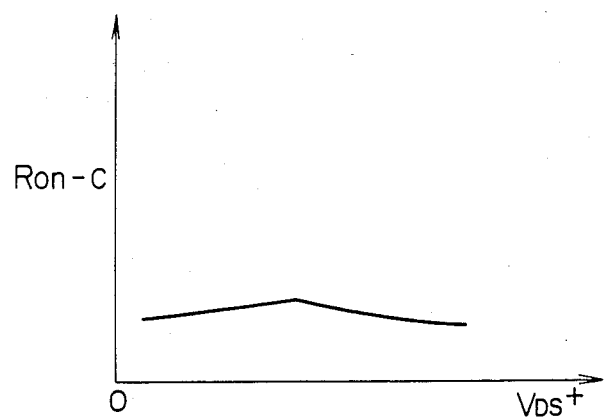
FIG. 15 is a graph showing the on-resistance of the C-MOS transistor in relation with $V_{DS}$.

When only N-MOS transistors are used in the load circuits, the on-resistance Ron-N of the N-MOS transistors varies depending on the magnitude of the input signal as shown in FIG. 8, and satisfactory linearity cannot be obtained. To cope with this matter, P-MOS transistors 31 and 34 having on-resistance characteristics as shown in FIG. 14 are connected in parallel to the N-MOS transistors 33 and 34, respectively, so that C-MOS transistor pairs are formed. The C-MOS transistor pair has the on-resistance characteristics as shown in FIG. 15, providing a substantially constant on-resistance Ron-C against the variation of the drain-source voltage $V_{DS}$, i.e., the variation of the input voltage Vin. As a result, the differential amplifier with load circuits of C-MOS transistors 31, 32, 33 and 34 has the linearity comparable with that of the differential amplifier with resistor load circuits shown in FIG. 4. Thus, a differential amplifier with very little output distortion is accomplished.

Figure 16:
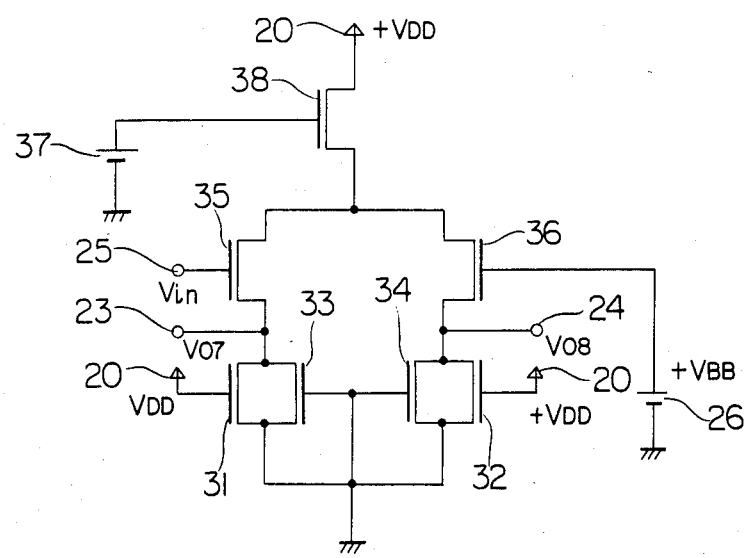
FIG. 16 is a schematic diagram showing the differential amplifier having a load circuit made of C-MOS transistors and amplifying P-MOS transistors.
Figure 17:
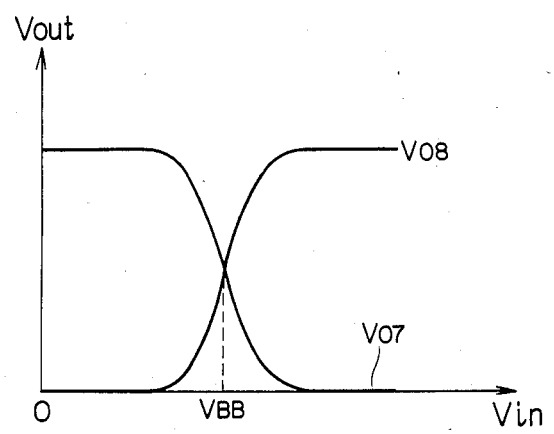
FIG. 17 is a graph showing the d.c. input-output characteristics of the amplifier shown in FIG. 16.

FIG. 16 shows a differential amplifier including amplifying MOS transistors 35 and 36 and a P-MOS transistor 38 used as a constant current source. In the arrangement, the transistors 35 and 36 are of the P-MOS type and the transistor 38 is also P-MOS with its gate electrode being connected to a bias voltage source 37. FIG. 17 shows the d.c. input-output characteristics of the differential amplifier shown in FIG. 16. On the graph, the ordinate indicates the output voltage Vout, the abscissa indicates the input voltage Vin, and the curves $V_{07}$ and $V_{08}$ represent the inverted and noninverted outputs, respectively. The arrangement of FIG. 16 employs P-MOS transistors 35, 36 and 38, providing lower output voltage levels as shown in FIG. 17, but having satisfactory linearity comparable with the case of FIG. 12. The on-resistance Ron-C of the C-MOS transistors 31, 32, 33 and 34 can be made arbitrarily by properly setting the dimensions of the gate area of these transistors. The power dissipation can be made as small as that of the arrangement shown in FIG. 12.

Figure 1:
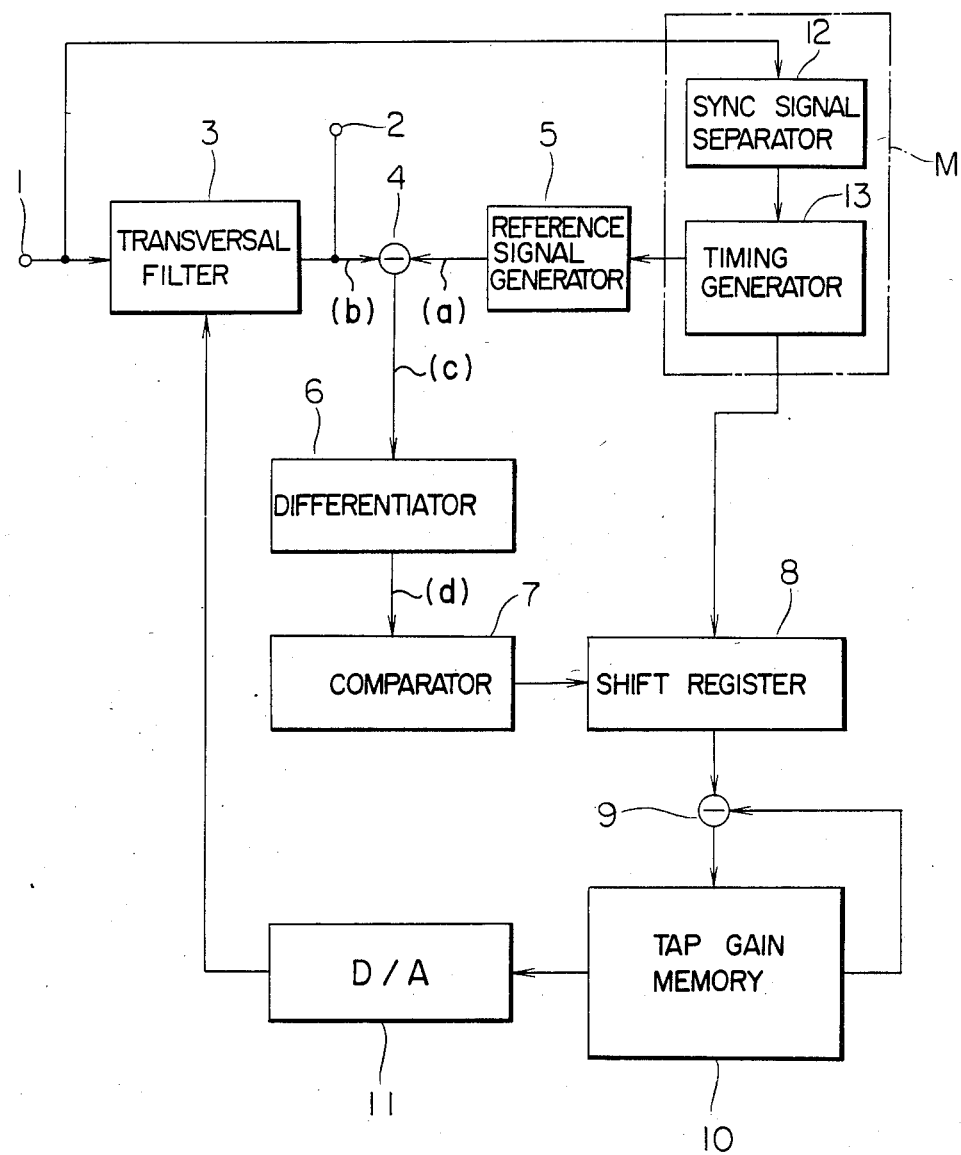
FIG. 1 is a block diagram showing the conventional ghost canceller.
Figure 2:
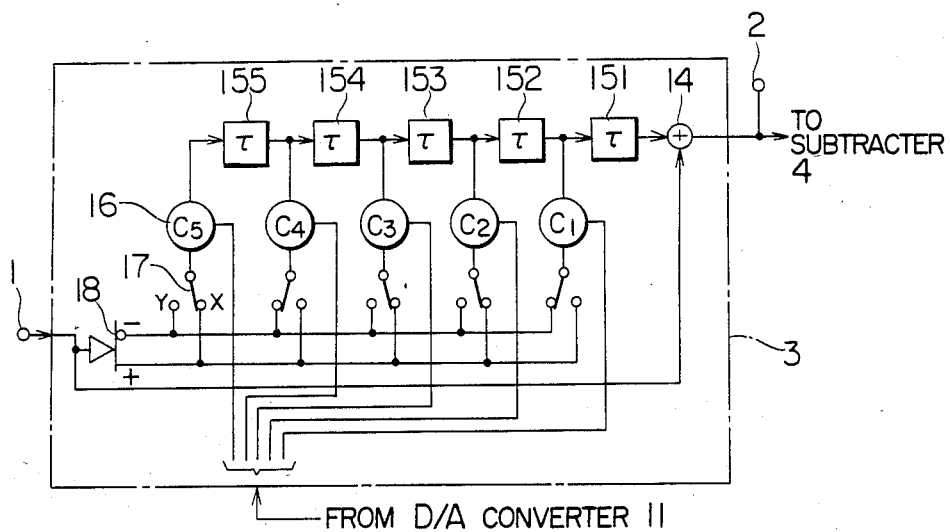
FIG. 2 is a block diagram showing the transversal filter used in the arrangement of FIG. 1.
Figure 3:
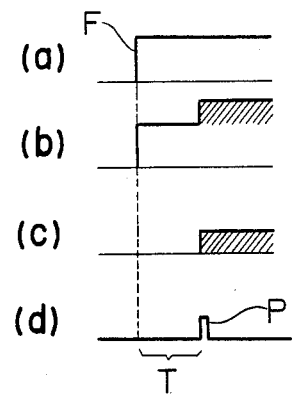
FIG. 3 is a set of waveform diagrams showing the signals of various portions in the ghost canceller.
Figure 18:
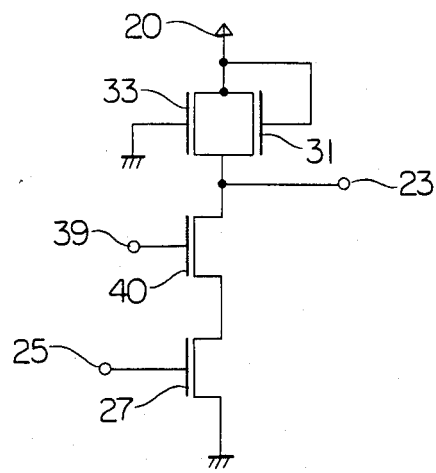
FIG. 18 is a schematic diagram of the tap amplifier having a load circuit made of a C-MOS transistor pair and amplifying N-MOS transistors.

FIG. 18 shows one embodiment of the tap amplifier 16 used in the transversal filter 3, wherein the amplifier has a load circuit made of C-MOS transistors. The arrangement includes an N-MOS transistor 31 and a P-MOS transistor 33 in the load circuit, and its inverted output terminal 23 is to be connected to the input of the delay element 15 in the transversal filter 3 shown in FIG. 2. Input terminal 25 is connected to the polarity selector switch 17 of FIG. 2. Tap gain control voltage input terminal 39 receives the analog voltage $V_{D/A}$ (tap gain control voltage) provided by the D/A converter 11 shown in FIG. 1. Transistor 40 is an N-MOS transistor for tap gain control, and transistor 27 is an N-MOS transistor for amplification.

Tap amplifiers have conventionally been arranged to have a resistor load circuit. By the replacement of the load resistor with C-MOS transistor pair 31 and 33, the on-resistance Ron-C of the C-MOS transistors 31 and 33 is constant irrespective of the variation of VDS across the transistors as shown in FIG. 15. Accordingly, the amplifier of FIG. 18 has the linearity comparable with the case of the resistor load circuit, and the on-resistance Ron-C of the C-MOS transistors 31 and 33 is determined by properly setting the dimensions of the gate area of these transistors. When the gate area is made smaller, the transistors 31 and 33 have a large on-resistance Ron-C, resulting in a reduction in the power dissipation.

Figure 19:
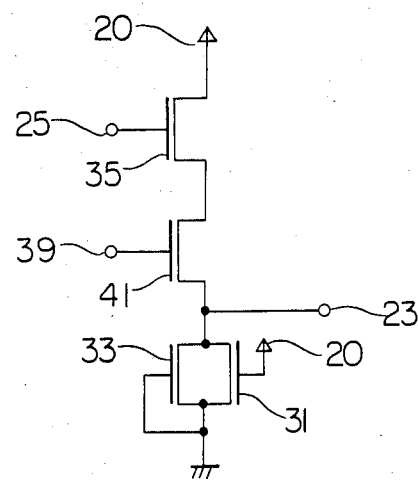
FIG. 19 is a schematic diagram showing the tap amplifier having a load circuit made of a C-MOS transistor pair and amplifying P-MOS transistors.

FIG. 19 shows a tap amplifier including a transistor 35 for amplification and a transistor 41 for tap gain control, both made of P-MOS transistors. The arrangement employs a load circuit of C-MOS transistor pair 31 and 33 with less variation in the on-resistance Ron-C, thus providing a satisfactory linearity. A relatively large load resistance can be formed by properly setting the dimensions of the gate area of the transistors 31 and 33.

As described in the foregoing embodiments, by the arrangement of the load circuit with C-MOS transistor pairs, the amplifier provides the linearity comparable with the case of the resistor load circuit, whereby the deghosting effect can be improved. In addition, a large load resistance can be obtained by properly selecting the dimensions of the gate area of the C-MOS transistors, and the power dissipation of the amplifier can be reduced. Moreover, a large load resistance achieved by the C-MOS transistors allows reduction in the chip area for the integrated circuit as compared with amplifiers with resistor load circuits.

We claim:

1. A transversal filter used in a ghost canceller of a television receiver comprising:
   (a) a first amplifier which receives an input video signal and provides a first output video signal in a same polarity as that of said input video signal and a second output video signal having a same amplitude as that of said first output video signal and a polarity opposite to that of said first output video signal;
   (b) a plurality of switches connected to said first amplifier and adapted to conduct selectively the first or second output video signal provided by said first amplifier;
   (c) a group of second amplifiers comprising a plurality of variable gain amplifiers connected to said switches correspondingly, each of said variable gain amplifiers having a terminal for receiving a control voltage, by which the amplitude of the first or second output video signal provided by corresponding one of said switches is varied;
   (d) group of delay elements comprising a plurality of delay elements connected in cascades, each of said delay elements being connected to a corresponding one of said variable gain amplifiers of said group of second amplifiers and operable to delay the first or second output video signal provided by said corresponding one variable gain amplifier for a predetermined time length; and
   (e) an adder connected to the output of said group of delay elements so as to receive the delayed first or second output video signal and adapted to receive the input video signal so that the delayed first or second output video signal is added to the input video signal,
   wherein said plurality of variable gain amplifiers of said group of second amplifiers each include an amplifying element formed by a MOS transistor which is loaded by a complementary connection of a P-MOS transistor and an N-MOS transistor constituting a C-MOS transistor pair.

2. A transversal filter according to claim 1, wherein said first amplifier includes an amplifying element formed by a MOS transistor which is loaded by a complementary connection of a P-MOS transistor and an N-MOS transistor constituting a C-MOS transistor pair.

* * * * *